United States Patent
Eskeldson et al.

(10) Patent No.: US 6,483,284 B1
(45) Date of Patent: Nov. 19, 2002

(54) WIDE-BANDWIDTH PROBE USING POLE-ZERO CANCELLATION

(75) Inventors: David D. Eskeldson, Colorado Springs, CO (US); Steven D Draving, Colorado Springs, CO (US); Kenneth Rush, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 6 days.

(21) Appl. No.: 09/885,709

(22) Filed: Jun. 20, 2001

(51) Int. Cl.[7] .......................... G01R 31/02; G01R 1/06; G01R 13/20
(52) U.S. Cl. ...................... 324/72.5; 324/149; 324/754; 324/121 R
(58) Field of Search ............................ 324/72.5, 121 R, 324/149, 754; 600/502

(56) References Cited

U.S. PATENT DOCUMENTS

| | | | | |
|---|---|---|---|---|
| 3,657,669 A | * | 4/1972 | Proakis | 333/18 |
| 3,906,344 A | * | 9/1975 | Addis et al. | 324/121 R |
| 4,260,951 A | * | 4/1981 | Lewyn | 600/502 |
| 4,743,839 A | | 5/1988 | Rush | 324/72.5 |
| 4,908,576 A | * | 3/1990 | Jackson | 714/726 |
| 5,172,051 A | * | 12/1992 | Zamborelli | 324/72.5 |
| 5,384,532 A | * | 1/1995 | Uhling | 324/754 |
| 5,627,476 A | * | 5/1997 | Chambers | 324/704 |
| 6,094,042 A | * | 7/2000 | Whiteman | 324/72.5 |
| 6,175,228 B1 | * | 1/2001 | Zamborelli et al. | 324/72.5 |

* cited by examiner

Primary Examiner—N. Le
Assistant Examiner—Wasseem H. Hamdan
(74) Attorney, Agent, or Firm—Regan L. Trumper (57) ABSTRACT

A probe apparatus for use with analyzing devices, primarily oscilloscopes and logic analyzers, which uses pole-zero cancellation to provide a probe with low capacitance and wide bandwidth. Pole-zero cancellation enables the probe to have constant gain at all frequencies. In one embodiment, the coaxial cable between the probe tip and the replication amplifier is terminated in its characteristic impedance to provide constant gain at all frequencies regardless of cable length. Use of pole-zero cancellation and thick film technology enables building a probe with a small, durable tip.

12 Claims, 7 Drawing Sheets

WIDE-BANDWIDTH PROBE USING POLE-ZERO CANCELLATION

BACKGROUND

This invention is concerned generally with probes, and more specifically with probes for detecting and replicating high speed electronic signals with minimum disturbance of signal and maximum fidelity of replication, commonly used with devices for analyzing the detected signals, including, for example, oscilloscopes.

The usefulness of a probe depends upon the range of frequencies for which the response is true to the detected signal, the accuracy of replication, and the extent to which the probe detects the signal without detrimentally affecting the operation of the system or circuit being probed. If the input resistance of the combined probe and end-use device is the same order of magnitude as that of the circuit or system being probed, it may cause errors in the replication of the signal or a change in the operation of the circuit or system resulting in erroneous output or circuit malfunction. High probe tip capacitance will also cause circuit loading problems at higher frequencies. Designing the probe to have low capacitance and an input impedance which is very high relative to the impedance of the circuit being probed at the point of probing has been the common protection against these errors. This high impedance caused very little current to flow through the probe, allowing the circuit to operate relatively undisturbed.

The frequency response of a probe is dependent upon the capacitance of the probe in parallel with the source resistance of the circuit under test. The capacitive reactance varies as a function of frequency causing the impedance of the probe to vary with frequency. This has limited the effective bandwidth of prior art available probes, because the impedance of the probes falls at high frequencies. Minimizing the capacitance of the probe tip has been one solution for increasing the useful bandwidth of the probe. However, the probe tip capacitance has been proportional to the probe cable length, making tip capacitance difficult to erase. Compensating for the capacitance by using active electronics at the probe tip has been a second alternative, which has been used for extending the effective bandwidth of the probe tip. This generally has caused the probe tip to be bulky and easily damaged.

Typical probes available in the prior art included high resistance probes which minimized resistive loading and had high input impedance at dc, but the impedance fell off rapidly with increasing frequency due to high input capacitance. High impedance cable was used with these probes to minimize capacitance, but this cable was very lossy at high frequencies, limiting bandwidth. These probes also required the measuring instrument to have a high impedance.

Also available were passive resistive-divider probes which had the lowest input capacitances available in a probe and therefore had a very broad bandwidth. However, the low input impedance could cause problems with resistive loading which could force the circuit under test into saturation, nonlinear operation, or to stop operating completely.

A third type of probes were active field effect transistor probes which had active electronics at the probe tip to compensate for loading problems due to low input impedance. These probes had a higher input impedance than the resistive divider probes and a lower capacitance than the high impedance probes, but were limited in bandwidth by the available field effect transistors and were bulky and easily damaged.

In other fields, a concept called pole-zero cancellation has been known. One application in which the concept is used is a system for measuring heart rate disclosed in U.S. Pat. No. 4,260,951 of Lanny L. Lewyn. In that system, pole-zero cancellation was used to cancel the long differentiation time constant so as to remove undesired shaping of the heart pressure wave caused by the second order feedback loop. This allowed the waveform to be refined so that it could enable greater accuracy in measuring the heart rate.

Figure 1:
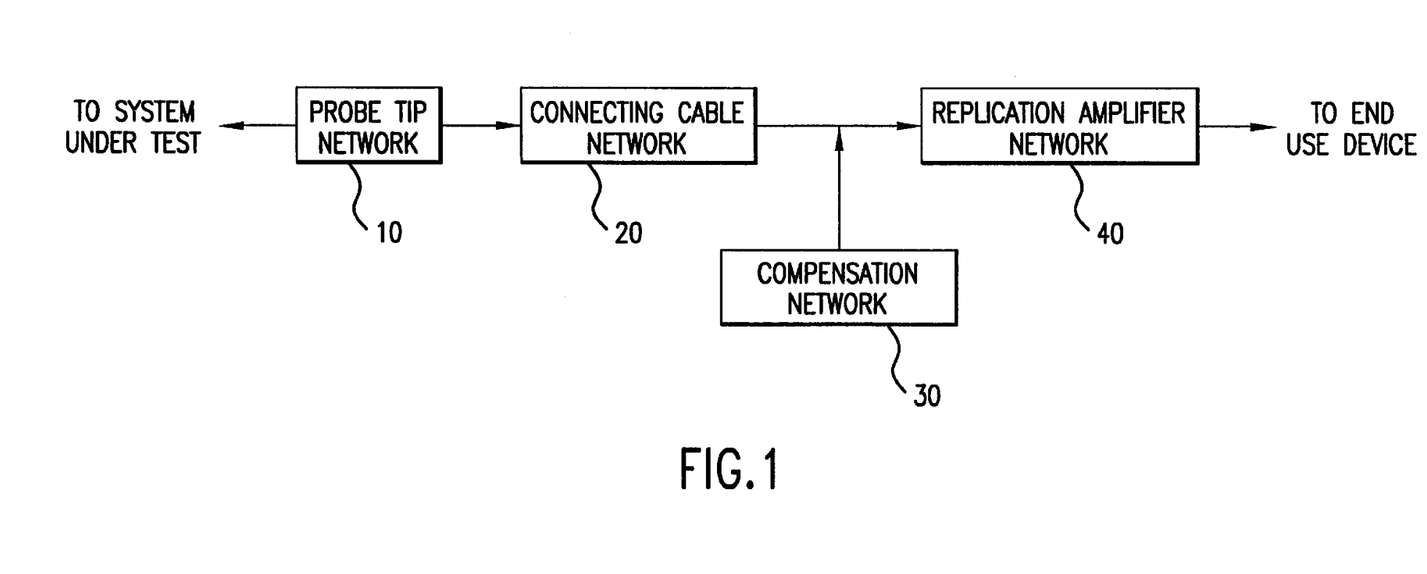
FIG. 1 is a block diagram of a probe according to the invention, specifically a probe for an oscilloscope or logic analyzer.

More recently, wide bandwidth probes with pole/zero cancellation have been utilized in probe tips. In U.S. Pat. No. 4,743,839 of Ken Rush, a pair of tip components (the "tip RC circuit") and a pair of feedback components (the "feedback RC circuit") are utilized. FIG. 1 shows a circuit diagram of the prior art probe circuitry of U.S. Pat. No. 4,743,839, the teachings of which are included herein by reference. Values for the components are chosen so that a zero created by the tip RC circuit 101 is at the same frequency as the pole created by the feedback circuit 102. The result of the probe circuitry is a constant gain over all frequencies. In addition, the terminating resistor 103, $R_{term}$, is matched to the cable characteristic impedance, $Z_0$, thus terminating the cable impedance to provide a constant, or flat, gain at all frequencies regardless of the cable length of the probe assembly. The feed back loop around the op-amp creates a virtual ground at the inputs, such that $R_{term}$ 103 is terminated into $V_{term}$ 104.

SUMMARY

The invention is generally to be used in probing devices of an electrical nature, with a preferred embodiment being used as a probe for a logic analyzer or an oscilloscope. The invention uses an application of the concept of pole-zero cancellation to improve the frequency response of the probe, and the concept of active termination of the coaxial cable in its characteristic impedance to provide a constant gain for the probe cable, independent of the length of the probe cable.

The operation of a probe tip in an embodiment of the invention utilized pole-zero cancellation. An resistor/capacitor ("RC") circuit at the tip of the probe creates a zero at the same frequency that a feedback RC creates a pole. The resultant gain of the probe tip from the two RC circuits is a constant across frequency. Further, the cable impedance, $Z_0$, is terminated into $R_{term}$ in a probe tip in accordance with the invention.

Additionally, a second pole and zero results from an embodiment of the invention. The additional pole is created by $R_{tap}$ and $C_{tot}$. $C_{tot}$ is the sum of the $C_{tip}$ and the capacitance of the trace between $R_{tap}$ and the tip RC, which is $C_{tap}$. By isolating $C_{tip}$ behind $R_{tap}$, this pole contributes to reducing the load a target sees. The electrical length and impedance of the trace $T_{tap}$ is variable, but the variations are accountable when calculating the pole crated at the tip.

DETAILED DESCRIPTION OF THE INVENTION

A preferred embodiment of the invention is shown in a general block diagram form in FIG. 1, defining four blocks with different functions. Block 10 is a probe tip network with detects a signal in a system under test. Block 20 is the connecting cable network, connected to the probe tip network at one end. At the other end, the connecting cable network is connected to block 30, the compensation network, and block 40, the replication amplifier network. The connecting cable network transfers the signal produced by the probe tip network. The compensation network modifies the frequency response to compensate for the transfer function of the probe tip network. The replication amplifier network reproduces the detected signal for the end-use device.

Figure 2:
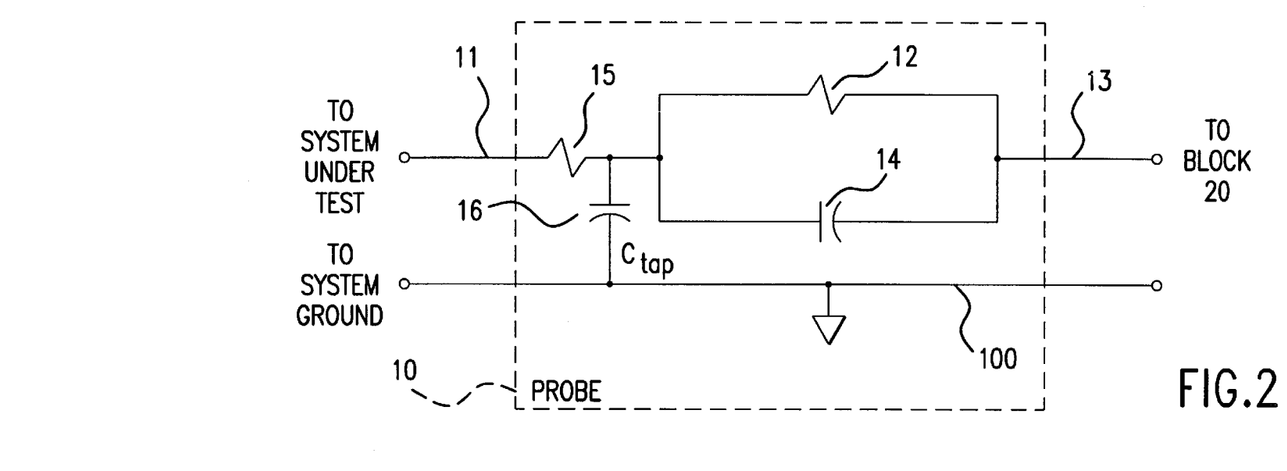
FIG. 2 is a schematic diagram of a probe tip network in accordance with the invention.

The probe tip network, block 10, may be constructed as represented in FIG. 2 with a parallel combination of a resistor $R_{tip}$, element 12, and capacitor $C_{tip}$, element 14 in series with the combination of $R_{tap}$, element 15, and $C_{tap}$, element 16. This probe tip network is placed in series between the probe tip, element 11, and the connection leading to block 20, line 13. A common ground, line 100, runs through the probe tip network from the system under test to block 20. Capacitor $C_{tap}$, element 16, is connected to the common ground, line 100, between the parallel combination of $R_{tip}$ and $C_{tip}$ and $R_{tap}$.

Figure 3:
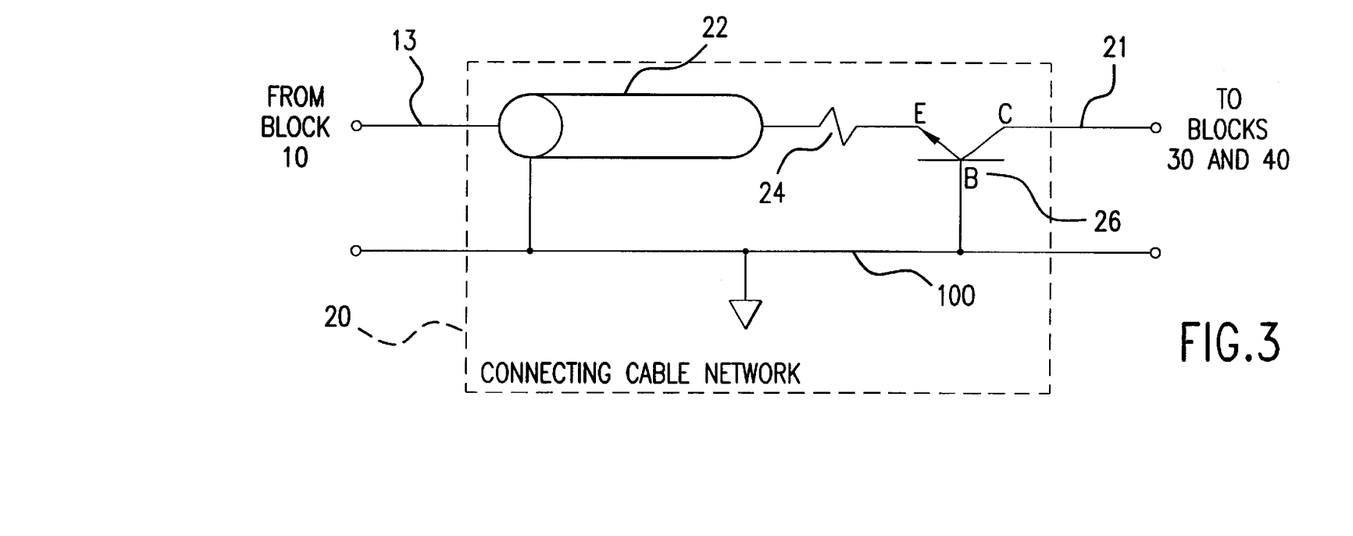
FIG. 3 is a schematic diagram of a connecting cable network in accordance with the invention.

A preferred form of connecting cable network, block 20, is represented in FIG. 3 as a coaxial cable, element 22, connecting line 13 to a resistor $R_e$, element 24. The outer sheath of the coaxial cable is connected to the common ground, line 100, entering block 20 from block 10 and continuing on to block 30 and block 40. The resistor Re is connected to emitter of a common-base configured bipolar junction transistor $Q_1$, element 26. The collector of the transistor $Q_1$ is connected to line 21, the output line for block 20. The base of $Q_1$ is connected to the collector of a second common-base configured bipolar junction transistor $Q_2$, element 27. Resistor $R_e$ is also connected to the base of transistor $Q_2$. The emitter of $Q_2$ is connected to the common ground, line 100. The second transistor $Q_2$ provides for improved linearity over the prior art and a lower input impedance and thus a lower power draw for the probe tip.

Figure 4:
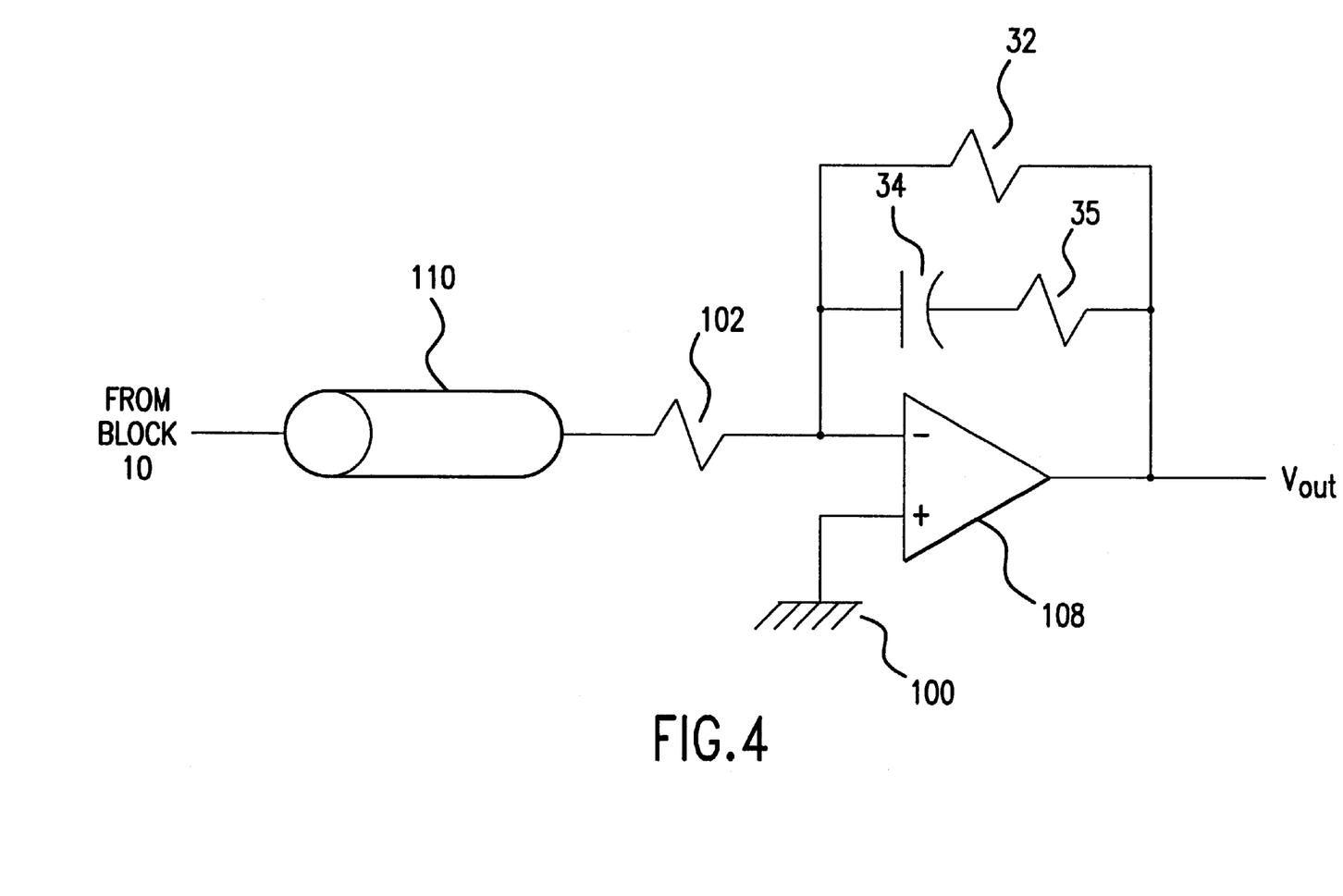
FIG. 4 is a schematic diagram of a compensation network.

The compensation network, block 30, may be implemented as represented in FIG. 4. A resistor $R_e$, element 102, is connected in series between the cable, element 110, preferably coaxial, and the inverting input terminal of an operational amplifier, element 108. The non-inverting input terminal of the operational amplifier is connected to the common ground, line 100. Connected between the inverting input terminal and the output terminal of the operational amplifier, element 108, is a parallel combination of a resistor $R_{fb}$, element 32, and a capacitor $C_{fb}$, element 34, and a second resistor $R_{pk}$ in series, element 35. The output terminal of the operational amplifier is connected to the end use device.

Figure 5:
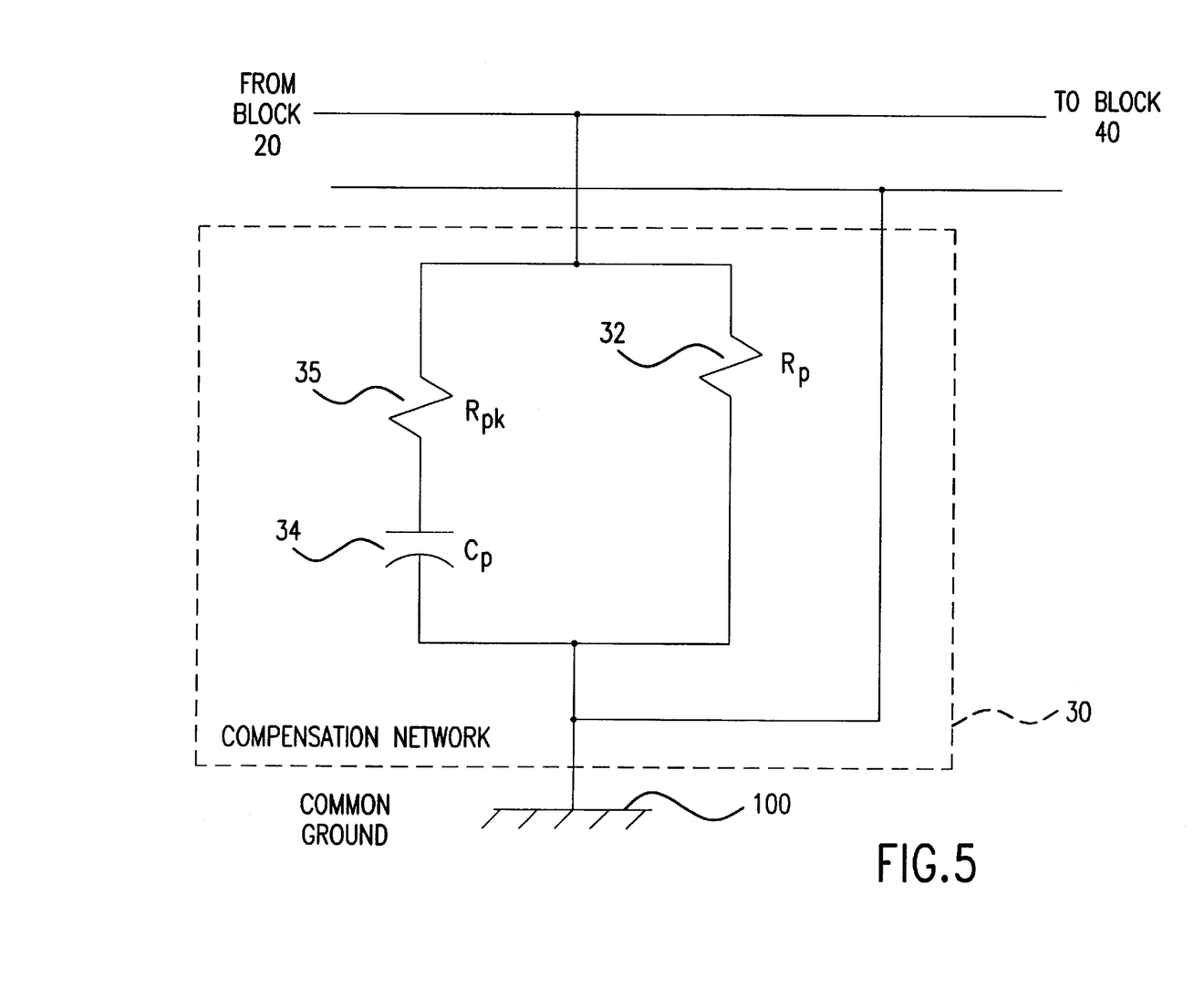
FIG. 5 is a schematic diagram of an alternative compensation network.

The compensation network, block 30, may be alternately implemented as represented in FIG. 5. A parallel combination of a resistor $R_{fb}$, element 32, and a capacitor $C_{fb}$, element 34, and a second resistor $R_{pk}$ in series, element 35, is connected to block 20 on one side of the combination and to the common ground, line 100, on the other side of the combination.

Figure 6:
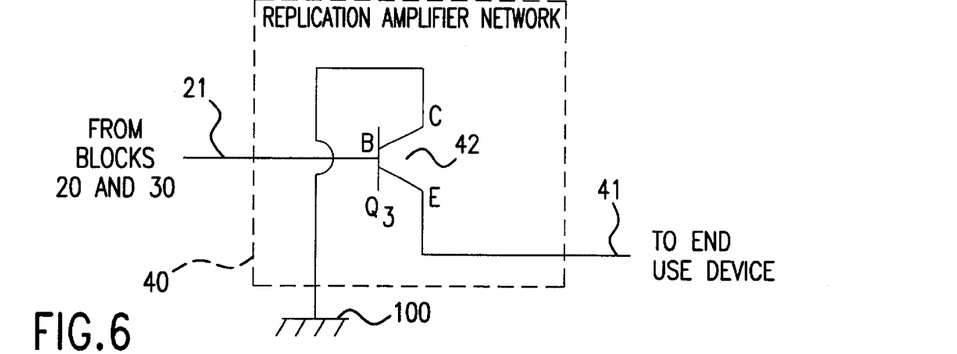
FIG. 6 is a schematic diagram of the replication amplifier network.

The replication amplifier network of block 40 may be realized as represented in FIG. 6 by a common-collector configured bipolar junction transistor Q3, element 42. The base of transistor Q3 is connected to line 21, the collector of transistor Q3 is connected to the common ground, line 100, and the emitter of transistor Q3 is connected to line 41, the output line for block 40. Line 41 and line 100 are connectable to the end use device after leaving block 40. The replication amplifier could also be implemented as a Darlington stage.

Low capacitance and high impedance at the probe tip are highly important to prevent loading the circuit under test and causing it to malfunction. The resistive element of the impedance is constant for all frequencies, while the reactive element will vary with frequencies. Capacitance causes the impedance to drop as the frequency of the measured signal increases, therefore minimizing capacitance is important for retaining high impedance and minimizing signal disturbances. Minimizing capacitance will also improve the performance of a probe with respect to rise time measurements and phase shift measurements, and will be a major factor in increasing the bandwidth.

Figure 7A:
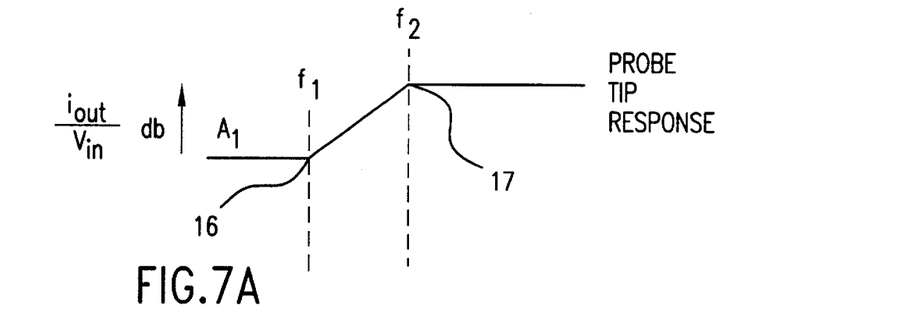
FIG. 7 is a graph of the ideal frequency response of relevant sections and the ideal frequency response of the entire probe in accordance with the invention.
Figure 7B:
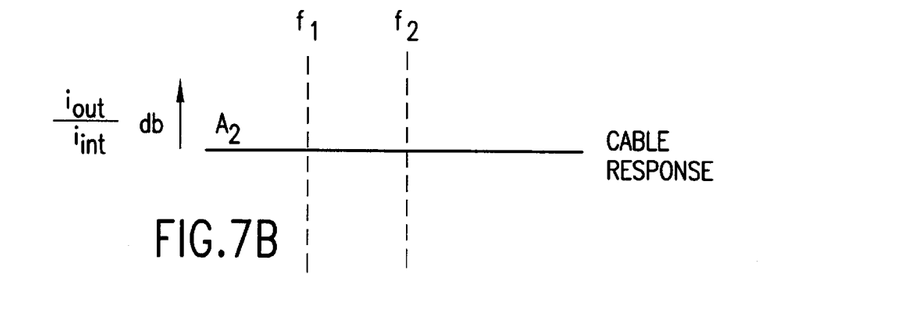
Figure 7C:
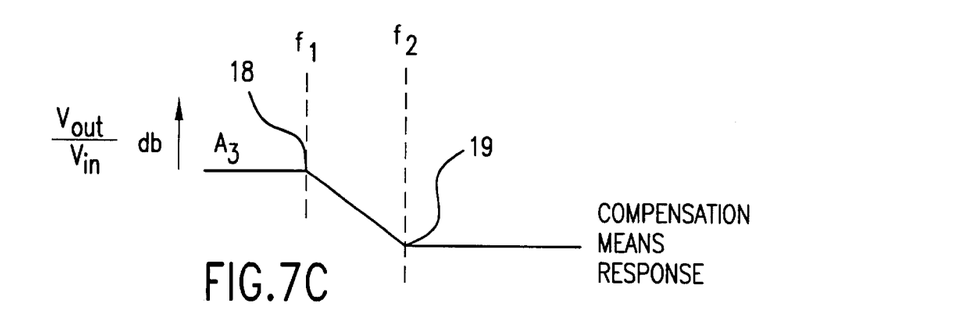
Figure 8:
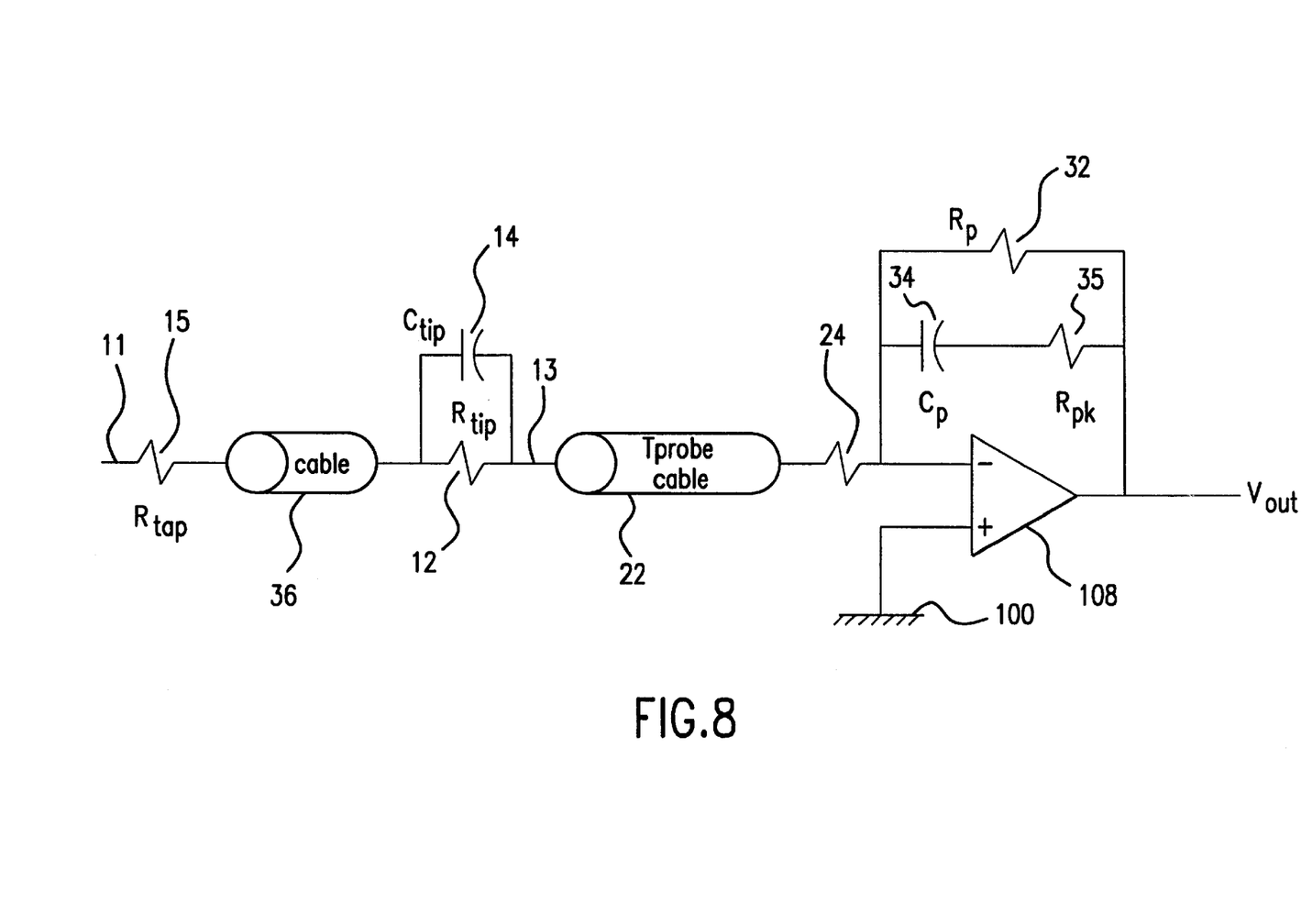
FIG. 8 is a simplified diagram illustrating specific circuitry for an embodiment of the invention.

FIG. 8 is a simplified diagram illustrating specific circuitry for an embodiment of the invention. The frequency response for the probe network is shown in FIGS. 7A, 7B and 7C. FIG. 8 corresponds to the embodiment of the compensation network illustrated in FIG. 4. The input from the probe tip passes through $R_{tap}$, element 15, through a transmission line (such as a trace on a PC board), element 36, and to the parallel combination of $R_{tip}$, element 12, and $C_{tip}$, element 14. This parallel tip RC creates a zero and the combination of $R_{tap}$, element 15, and the capacitance of element 36, creates a pole. The zero created by the tip RC circuit is seen in FIG. 7A at point 16. The pole created by $R_{tap}$, element 15, is seen in FIG. 7A at point 17.

The zero and pole created by the probe tip network are cancelled by the RC network in the compensation network, elements 32, 34, and 35. A pole is created by $R_p$, element 32, and $C_p$, element 34. The pole created by $R_p$, element 32, and $C_p$, element 34, is seen in FIG. 7B at point 18. A zero is also created in the network by $R_{pk}$, element 35, and $C_p$, element 34. The zero created in the network is seen in FIG. 7C at point 19.

Figure 9:
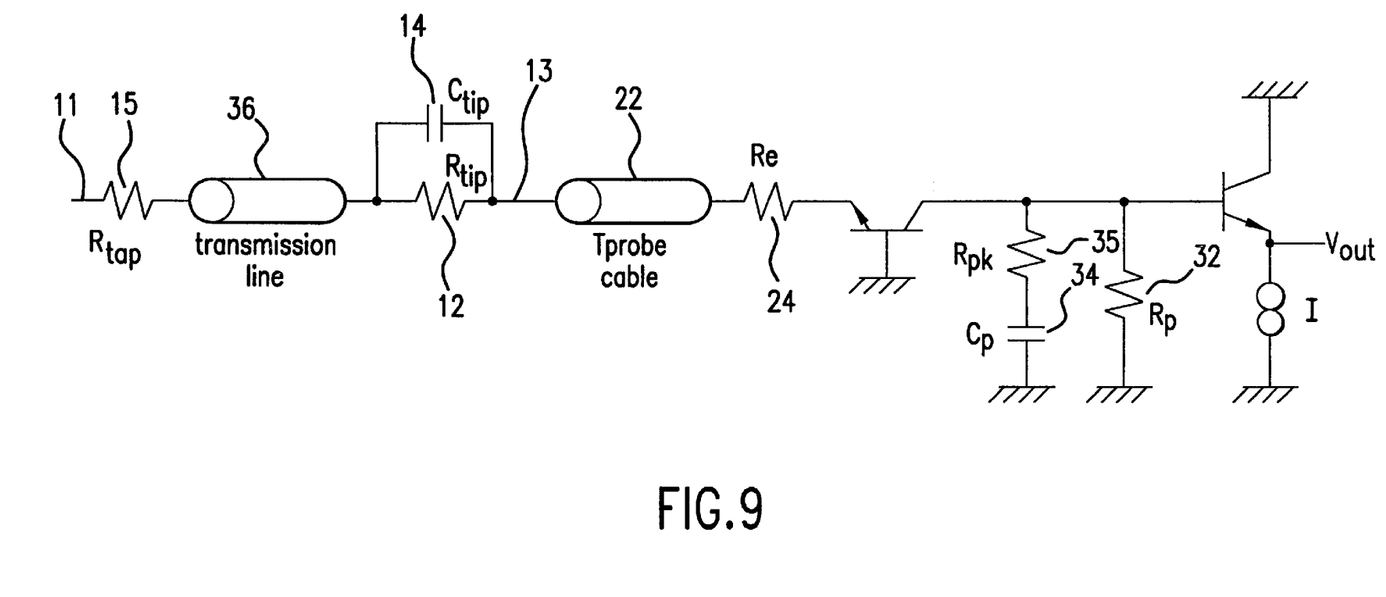
FIG. 9 is an alternate diagram illustrating specific circuitry for an embodiment of the invention.

FIG. 9 is an alternate diagram illustrating specific circuitry for an embodiment of the invention. The frequency response for the probe network is also shown in FIGS. 7A, 7B and 7C. FIG. 9 corresponds to the embodiment of the compensation network illustrated in FIG. 5. The input from the probe tip passes through $R_{tap}$, element 15, through a transmission line (such as a trace on a PC board), element 36, and to the parallel combination of $R_{tip}$, element 12, and $C_{tip}$, element 14. This parallel tip RC creates a zero and the combination of $R_{tap}$, element 15, and the capacitance of element 36, creates a pole. The zero created by the tip RC circuit is seen in FIG. 7A at point 17.

The zero and pole created by the probe tip network are cancelled by the RC network in the compensation network, elements 32, 34 and 35. A pole is created by $R_p$, element 32, and $C_p$, element 34. The pole created by $R_p$, and $C_p$, element 34, is seen in FIG. 7B at point 18. A zero is also created in the network by $R_{pk}$, element 35, and $C_p$, element 34. The zero created in the network is seen in FIG. 7C at point 19.

FIG. 7A–C show the frequency response of a probe according to the invention due to each specific section of the probe. It can be seen that the frequency response for the probe tip and the compensation network cancel each other. The effect is a flat overall frequency response. At a first frequency, $f_1$, a zero is created in the probe tip and a response pole is created in the compensation network. At a second frequency, $f_2$, a pole is created in the probe tip and a response zero is created in the compensation network. As discussed above, to compensate or cancel the pole created at the tip, a zero was created in the feedback loop by inserting $R_{pk}$ in series with $C_p$. Preferably, the zero created by $R_{pk}$ in series with $C_p$ is at the same frequency as the pole introduced at the tip caused by $R_{tap}$ and $C_{tap}$ in parallel. As seen in FIG. 7B, the circuit is balanced to have a constant gain across frequency.

Ideally, the cable, element 22, would not have any loss. However, in reality, the cable frequency response will experience a slight drop at higher frequencies well above $f_2$. This is due to a lossy element in the circuit that is often ignored. The cable itself acts as a series of distributed high-frequency poles, caused by dielectric and skin effect loses. These losses are mostly a function of cable width and length. They have the effect of reducing gain at higher frequencies. To compensate for the cable drop off experience in the real world, the zero created at the compensation network will occur at a frequency slightly lower than $f_2$, $f_2-\Delta$. This compensation for the effect of cable loss can be realized by choosing a $R_{pk}$ value so that the zero created by $Rpk/C_p$ is at a slightly lower frequency that the pole created by $R_{tap}/C_{tap}$. A similar slight adjustment is possible to the zero created by $R_{tip}/C_{tip}$ and the pole created by $R_p/C_p$. In this manner, over the frequency range of interest, the cable loss can be compensated for.

This invention allows a tradeoff of tip resistor value and placement relative to $R_{tip}/C_{tip}$. This tradeoff is valuable to a customer in need of placing a probe tip in a densely packed PC board layout. By allowing $R_{tap}$ to be placed at a short distance from $R_{tip}/C_{tip}$, congestion in the layout can be alleviated by placing $R_{tip}/C_{tip}$ in a more convenient location. The customer can then make a determination between $R_{tap}$ and $C_{tap}$ to maintain a pole at a specified frequency, which allows the customer to make a determination between probe loading and coupling.

Due to the fact that $R_{tap}$ is moveable some electrical distance away from $R_{tip}/C_{tip}$, the PC board layout congestion is alleviated. For optimum performance, both for probe and for the customer's target, the tip of the probe must be place very close to the customer's target. Since many customers have dense layouts, allowing for flexibility in placing only a single component at the target, and then moving the rest of the probe away from the components simplifies layout considerations. In many cases, if all three tip components were required to be place at the customer's target, layout considerations would make probing impossible.

Determination of the values of the components of a probe in accordance with the invention is understood by those skilled in the art. The time constants of the two RC networks must be equal so that the zeros and poles balance out as shown in FIG. 7. In one embodiment of the invention, $R_{tap}$ is 125Ω, $C_{tip}$ is 0.3 pF, $R_{tip}$ is 20KΩ, $R_p$ is 2KΔ, $C_p$ is 3 pF and $R_{pk}$ is 150Δ. Also in one embodiment of the invention, the length of the cable, $T_{probe}$, is 2 meters and has a characteristic impedance of 75Δ. Those skilled in the art will understand that the length of the cable, $T_{probe}$, effects the noise of the circuit and limits the maximum achievable bandwidth of the probe.

Other possible variations in the specific embodiments disclosed are possible. It is understood that although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A probe apparatus for detecting first electronic signals in a system under test and replicating said first signals for an end use device, comprising:

detection means for detecting said first electronic signals and producing second electronic signals in response to said first signals, said detection means having a transmission zero in the frequency response at a preselected first frequency and a transmission pole in the frequency response at a preselected second frequency;

compensation means, having a first end and a second end, said first end of compensation means connected to ground, the other end tied to the signal for compensation of said transmission zero of said detection means, said compensation means having a transmission pole in the frequency response at a frequency substantially equal to said preselected first frequency and for compensation of said transmission pole of said detection means, said compensation means having a transmission zero in the frequency response at a frequency substantially equal to said preselected second frequency;

replication means, having a first end, a second end, and a third end, connectable to said end use device at said first end of replication means, said second end of replication means connected to ground, for replicating said first electronic signals in response to said second electronic signals for use in said end use device; and cable means, having a first end, a second end, and a third end, connected to said detection means at said first end of cable means and connected to said second end of said compensation means and said third end of said replication means at said second end of cable means and connected to ground at said third end of cable means, for transferring said second electronic signals from said detection means to said replication means and said compensation means, wherein said cable means comprises a transfer means, having a characteristic impedance, for transferring said second electronics signals within said cable means and a termination means for terminating said transfer means in said characteristic impedance of said transfer means and for transferring said second electronic signals from said transfer means to said replication means and said compensation means.

2. A probe apparatus for detecting and replicating electronic signals as recited in claim 1, wherein said detection means comprises a probe tip network having a first resistor and a second resistor and a first capacitor, said second resistor and first capacitor being connected in parallel forming a first RC circuit and said first resistor being connected in series to said first RC circuit, said probe tip network being connected in series from a probe tip to said first end of said cable means.

3. A probe apparatus for detecting and replicating electronic signals as recited in claim 1, wherein said compensation means comprises a compensation network having a first resistor and a second resistor and first capacitor, said second resistor and first capacitor being connected in series forming a first RC circuit and said first resistor being connected in parallel to said first RC circuit, said compensation network being connected in series from said second end of said cable means to a common ground.

4. A probe apparatus for detecting and replicating electronic signals as recited in claim 1, wherein said replication means comprises a first transistor having a first base, a first emitter, and a first collector.

5. A probe apparatus for detecting and replicating electronic signals as recited in claim 4, wherein said first base is connected to said cable means, said first collector is connected to a common ground, and said first emitter is connectable to said end use device.

6. A probe apparatus for detecting and replicating electronic signals as recited in claim 1, wherein said termination means comprises a third resistor and a second transistor, having a second base, a second collector, and a second emitter.

7. A probe apparatus for detecting and replicating electronic signals as recited in claim 6, wherein said third resistor is connected in series between said transfer means and said second emitter, said second base is connected to a common ground, and said second collector is connected to said compensation means and said replication means.

8. A probe apparatus for detecting and replicating electronic signals as recited in claim 7, wherein said transfer means comprises a coaxial cable.

9. A probe apparatus for detecting and replicating electronic signals as recited in claim 6, wherein said transfer means comprises a coaxial cable.

10. A probe apparatus for detecting and replicating electronic signals as recited in claim 1, wherein said transfer means comprises a coaxial cable.

11. A probe apparatus for detecting and replicating electronic signals as recited in claim 1, wherein:

said detection means comprises a probe tip network having a first resistor and a second resistor and a first capacitor, said second resistor and first capacitor being connected in parallel forming a first RC circuit and said first resistor being connected in series to said first RC circuit, said probe tip network being connected in series from a probe tip to said first end of said cable means;

said compensation means comprises a compensation network having a first resistor and a second resistor and first capacitor, said second resistor and first capacitor being connected in series forming a first RC circuit and said first resistor being connected in parallel to said first RC circuit, said compensation network being connected in series from said second end of said cable means to a common ground;

said replication means comprises a first transistor having a first base, a first emitter, and a first collector, said first collector is connected to said common ground, and said first emitter is connected to said end use device;

said transfer means comprises a coaxial cable; and wherein said termination means comprises a third resistor and a second transistor, having a second base, a second collector, and a second emitter, said third resistor is connected in series between said transfer means and said second emitter, said second base is connected to a common ground, and said second collector is connected to said compensation means and said replication means.

12. A probe apparatus for detecting and replicating electronic signals as recited in claim 1, wherein said transmission pole in the frequency response generated by said compensation means is at a frequency slightly lower than the frequency of the zero generated by the detection means.

* * * * *